United States Patent
Noda et al.

(10) Patent No.: US 9,084,067 B2
(45) Date of Patent: Jul. 14, 2015

(54) METHOD OF MANUFACTURING RESONANT TRANSDUCER

(71) Applicant: Yokogawa Electric Corporation, Tokyo (JP)

(72) Inventors: Ryuichiro Noda, Tokyo (JP); Takashi Yoshida, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 281 days.

(21) Appl. No.: 13/689,199

(22) Filed: Nov. 29, 2012

(65) Prior Publication Data
US 2013/0139377 A1 Jun. 6, 2013

(30) Foreign Application Priority Data
Dec. 2, 2011 (JP) ................................ 2011-264543

(51) Int. Cl.
*H01L 41/22* (2013.01)
*H04R 31/00* (2006.01)
(Continued)

(52) U.S. Cl.
CPC .............. *H04R 31/00* (2013.01); *B81C 1/0015* (2013.01); *B81C 1/00666* (2013.01); *H03H 3/0072* (2013.01); *B81B 2201/0271* (2013.01); *B81C 2201/0164* (2013.01); *B81C 2201/0173* (2013.01); *Y10T 29/49005* (2015.01)

(58) Field of Classification Search
CPC .. H03H 3/0072; H03H 9/1057; H01L 41/331; H01L 41/083
USPC .............. 29/25.35, 592.1, 594, 595; 333/186, 333/197; 438/50, 54
See application file for complete search history.

(56) References Cited

U.S. PATENT DOCUMENTS

| | | | | |
|---|---|---|---|---|
| 5,188,983 A | * | 2/1993 | Guckel et al. | ................... 438/53 |
| 5,510,276 A | * | 4/1996 | Diem et al. | .................... 438/53 |
| 8,294,534 B2 | * | 10/2012 | van der Avoort et al. | ..... 333/186 |

(Continued)

FOREIGN PATENT DOCUMENTS

| | | |
|---|---|---|
| EP | 2 302 792 A1 | 3/2011 |
| JP | 1299428 A | 12/1989 |
| JP | 200537309 A | 2/2005 |

OTHER PUBLICATIONS

Search Report dated Sep. 17, 2014 issued by the European Patent Office in counterpart European Patent Application No. 12195311.1.
(Continued)

*Primary Examiner* — Minh Trinh
(74) *Attorney, Agent, or Firm* — Sughrue Mion, PLLC

(57) ABSTRACT

A method of manufacturing a resonant transducer having a vibration beam includes: (a) providing an SOI substrate including: a first silicon layer; a silicon oxide layer on the first silicon layer; and a second silicon layer on the silicon oxide layer; (b) forming a first gap and second gap through the second silicon layer by etching the second silicon layer using the silicon oxide layer as an etching stop layer; (c) forming an impurity diffusion source layer on the second silicon layer; (d) forming an impurity diffused layer in a surface portion of the second silicon layer; (e) removing the impurity diffusion source layer through etching; and (f) removing at least a portion of the silicon oxide layer through etching such that an air gap is formed between the first silicon layer and a region of the second silicon layer surrounded by the first and second gaps.

7 Claims, 17 Drawing Sheets

(51) Int. Cl.
*B81C 1/00* (2006.01)
*H03H 3/007* (2006.01)

(56) References Cited

U.S. PATENT DOCUMENTS

| | | | |
|---|---|---|---|
| 8,819,904 B2* | 9/2014 | Gorisse et al. | 29/25.35 |
| 8,828,771 B2* | 9/2014 | Wang | 438/50 |
| 2011/0279201 A1 | 11/2011 | Pensala et al. | |
| 2012/0060607 A1 | 3/2012 | Yoshida | |

OTHER PUBLICATIONS

Patrick Ruther, et al. "Microelectromechanical HF Resonators Fabricated Using a Novel SOI-Based Low-Temperature Process"; IEEE Sensors Journal, vol. 5, No. 5 Oct. 2005; pp. 1112-1119.
Search Report dated Jun. 25, 2014 issued by the European Patent Office in corresponding Application No. 12195311.1.
Alan D. Raisanen, "Doping processes for MEMS", In: "MEMS Materials and Processes Handbook", Mar. 18, 2011, XP055123931, 1 pg. total.

* cited by examiner

34: FIRST ELECTRODE PLATE
35: SECOND ELECTRODE PLATE
36: THIRD ELECTRODE PLATE
31: SUBSTRATE
33: VACUUM ROOM
32: VIBRATION BEAM

39: SHELL
37: FIRST GAP
35: SECOND ELECTRODE PLATE
32: VIBRATION BEAM
33: VACUUM RO
38: SECOND GAP
36: THIRD ELECTRODE PLATE
311: SURFACE OF SUBSTRATE 31
31: SUBSTRATE (MEASUREMENT DIAPHRAGM)

101: SOI SUBSTRATE

201: TENSION ADJUSTMENT LAYER
101: SOI SUBSTRATE

201: TENSION ADJUSTMENT LAYER
32: VIBRATION BEAM
37: FIRST GAP
38: SECOND GAP
101: SOI SUBSTRATE

202: IMPURITY DIFFUSION SOURCE LAYER
201: TENSION ADJUSTMENT LAYER
101: SOI SUBSTRATE

202: IMPURITY DIFFUSION SOURCE LAYER
201: TENSION ADJUSTMENT LAYER
203: IMPURITY DIFFUSED LAYER
101: SOI SUBSTRATE

1:n-TYPE SILICON SINGLE CRYSTAL SUBSTRATE

1: n-TYPE SILICON SINGLE CRYSTAL SUBSTRATE

*FIG. 17*

| IMPURITY | COVALENT BOND RADIUS Ri (Å) | $R_i/R_{si}$ |
|---|---|---|
| P | 1.10 | 0.940 |
| As | 1.18 | 1.001 |
| Sb | 1.36 | 1.162 |
| B | 0.86 | 0.752 |
| C | 0.77 | 0.658 |
| Si | 1.17 | 1 |
| Ge | 1.22 | 1.043 |
| Sn | 1.40 | 1.197 |

METHOD OF MANUFACTURING RESONANT TRANSDUCER

This application claims priority from Japanese Patent Applications No. 2011-264543, filed on Dec. 2, 2011, the entire contents of which are herein incorporated by reference.

BACKGROUND

1. Technical Field

Embodiments described herein relate to a method of manufacturing a resonant transducer.

2. Related Art

FIGS. 6-17 illustrate the configuration of an essential part of a related-art resonant transducer. FIG. 6 illustrates the structure of an essential assembly, FIGS. 7-15 illustrate a manufacturing process, FIGS. 16A and 16B illustrate a circuit corresponding to the essential assembly of FIG. 6, and FIG. 17 illustrates the operation of the related-art resonant transducer.

A manufacturing process will be described below. As shown in FIG. 7, a silicon oxide film 10a is formed on an n-type silicon single crystal substrate 1 and then patterned. A recess is formed in the substrate 1 by undercutting it in an oxide-film removed region, and $p^+$ single crystal silicon 11 is formed there at a boron concentration of $10^{18}$ cm$^{-3}$ by selective epitaxial growth.

Then, $p^{++}$ single crystal silicon 12a is grown upward on the surface of the $p^+$ single crystal silicon layer 11 at a boron concentration of $3\times10^{19}$ cm$^{-3}$ or higher. The $p^{++}$ single crystal silicon layer 12a will later serve as a vibration beam 3, and a gap will be formed later under the vibration beam 3 in the space currently occupied by the $p^+$ single crystal silicon layer 11.

Then, as shown in FIG. 8, a silicon oxide film 10b is formed on the surface of the substrate 1 including the surface of the $p^{++}$ single crystal silicon layer 12a. Recesses D formed by removing the silicon oxide film 10b partially will later serve as grounding portions of a shell 4 to the substrate 1.

Then, as shown in FIG. 9, a silicon nitride film 13 is formed on the surface of the silicon oxide film 10b as well as inside the recesses D and then patterned. A gap will be formed later over the vibration beam 3 in the space that is currently occupied by those portions of the silicon oxide film 10b and the silicon nitride film 13 which are located on the $p^{++}$ single crystal silicon layer 12a (vibration beam 3). The capacitance is determined by the thicknesses of these films and the area of the vibration beam 3. Therefore, the capacitance that is necessary for driving of and detection by the vibration beam 3 can be optimized by adjusting these dimensions properly.

Then, as shown in FIG. 10, $p^{++}$ polysilicon 14 is formed over the entire surface and patterned to form etching liquid introduction holes E for sacrificial layer etching. The $p^{++}$ polysilicon layer 14 will later serve as interconnections to lead from the shell 4 to an electrode. The interconnections can be formed using $p^{++}/p^+$ single crystal silicon or by diffusing an impurity into the silicon substrate 1 before the selective epitaxial growth. It is advantageous that the interconnections be formed by a method that minimizes parasitic capacitances between the silicon substrate 1 and the interconnections.

Subsequently, as shown in FIG. 11, hydrofluoric acid is introduced through the etching liquid introduction holes E, whereby part of the silicon nitride film 13 and part of the silicon oxide film 10b are removed. In the connecting portions to the silicon substrate 1, the silicon nitride film 13 serves as an etching stop layer because of its low etching rate.

Then, as shown in FIG. 12, the $p^+$ single crystal silicon layer 11 is removed by an alkaline solution (e.g., hydrazine, KOH, or TMAH). Neither the $p^{++}$ single crystal silicon layer 12a nor the $p^{++}$ polysilicon 14 is etched because of high impurity concentrations. During the etching with the alkaline solution, the n-type silicon substrate 1 can be protected from the etching by applying a voltage of 1 to 2 V to it. The etching in the longitudinal direction of the vibration beam 3 is stopped utilizing the fact the etching rate of single crystal silicon in the <111> direction is low.

Then, as shown in FIG. 13, sealing members 15 (made of $SiO_2$, glass, or the like formed by sputtering) are formed by sputtering, evaporation, CVD, epitaxial growth, or the like, whereby the etching liquid introduction holes E are closed and a minute vacuum room 5 is formed. The electrical insulation between the shell 4 and the vibration beam 3 can be made more stable by, for example, forming silicon oxide films on the surfaces of the vibration beam 3 and the inside surfaces of the vacuum room 5 by thermal oxidation before this step. In this case, the sealing members can be made of a conductive material.

Then, as shown in FIG. 14, electrical interconnections which lead from the vibration beam 3 and the shell 4 are formed by patterning the $p^{++}$ polysilicon layer 14 and bonding pad electrodes are formed.

Then, as shown in FIG. 15, a diaphragm is formed by thinning the silicon substrate 1 from the back side.

FIG. 16A is a plan view showing a state that electrical interconnections 20 have been formed so as to be connected to the vibration beam 3 and the shell 4 by patterning the $p^{++}$ polysilicon layer 14 and bonding Al electrodes 21 have also been formed.

FIG. 16B is a circuit diagram of a resonant transducer including the assembly of FIG. 6. In FIG. 16B, Vb denotes a bias voltage (constant voltage); Vi, a drive voltage (AC voltage); R1 and R2, wiring resistances; and R3, a substrate resistance. C1 denotes a capacitance between the vibration beam 3 and the shell 4, C2 designates a parasitic resistance, and C3 and C4 stand for capacitances between the substrate 1 and the interconnections 20. The values of these parameters are determined by the interconnection forming method, the patterns of the interconnections 20, and other factors. These factors should be determined so as to minimize the values of these parameters.

Referring to FIG. 16B, if the capacitance C1 between the vibration beam 3 and the shell 4 is constant, the amplitude of an output current is proportional to $(C1+C2)\cdot Vi\cdot\omega$, where $\omega$ is the frequency of the drive voltage Vi. On the other hand, when the capacitance C1 is resonating at the frequency $\omega$, a current whose amplitude is approximately proportional to $\Delta C1\cdot Vb\cdot\omega$ is added, where $\Delta C1$ is a variation component of C1 due to the resonance. A resonant frequency is detected using this current change.

Incidentally, if no initial tensile strain is imparted to the vibration beam 3 even while no measurement pressure Pm exists, the vibration beam 3 may be buckled by a measurement pressure Pm to cause a state that a measurement cannot be performed. Furthermore, the sensitivity varies unduly unless the variation of this initial tensile strain is controlled. This will be described below.

FIG. 17 shows the covalent bond radii Ri of various impurities and their ratios to the covalent bond radius $R_{Si}$ of silicon.

As seen from FIG. 17, the covalent bond radii Ri of phosphorus (P) and boron (B) are 1.10 Å and 0.88 Å, respectively, which are shorter than the covalent bond radius $R_{Si}$ of silicon (Si) which is 1.17 Å. Therefore, when boron or phosphorus is implanted into single crystal silicon, tensile strain occurs in the implanted portion. In the case of boron, the strain is approximately equal to $4 \times 10^{-4}\epsilon$ ($=2 \times 10^{-3}/5.431$) because the lattice constant variation of boron is $2 \times 10^{-3}$ Å when its concentration is $10^{20}$ cm$^{-3}$ and the lattice constant of silicon is 5.431 Å.

Strain that is larger than $4 \times 10^{-4}\epsilon$ can be produced in the following manner. For example, if boron is implanted at a concentration of $2 \times 10^{20}$ cm$^{-3}$ which is two times the above value, initial tensile strain of $8 \times 10^{-4}\epsilon$ occurs in proportion to the implantation amount. Therefore, an arbitrary initial tensile strain can be obtained by implanting boron at a proper concentration.

Based on the above principle, the vibration beam 3 shown in FIG. 6 is given initial tensile strain. The strain that is given to the vibration beam 3 can be made smaller than $4 \times 10^{-4}\epsilon$ by increasing the boron concentration in the n-type silicon substrate 1 or lowering the boron concentration in the vibration beam 3 by causing boron atoms in the vicinity of the surfaces of the vibration beam 3 to segregate in an oxide by oxidizing the vibration beam 3 and then removing the oxide film with BHF. Almost no strain occurs when the boron concentration is equal to about $10^{17}$ cm$^{-3}$ (see, for example, JP-A-01-299428 and JP-A-2005-037309).

The above-described conventional resonant transducer has the following problems. Since the vibration beam 3 vibrates perpendicularly to the substrate 1 and the vibration beam 3, an excitation electrode, and a vibration detection electrode have a layered structure, a manufacturing process requires many processing steps. Since selective etching utilizing an impurity concentration difference is performed in forming the vibration beam 3, the boron concentration should be set higher than $4 \times 10^{19}$ cm$^{-3}$.

In the epitaxial method, because of occurrence of defects and dislocations in the vibration beam 3, it is difficult to accurately control the tensile strain of the vibration beam 3 and the vibration beam 3 cannot be given high tensile strain when it is thick. Furthermore, a wafer may be warped by tensile film stress that is caused by the impurity. As such, in the epitaxial method, a vibration beam 3 that is thick and is given high tensile strain cannot be formed. On the other hand, to form a vibration beam 3 that is thick and is given high tensile strain by a related-art diffusion method, the diffusion length needs to be increased, resulting in a long diffusion time. For example, high tensile strain that is higher than 300μ∊ cannot be attained.

Furthermore, in the epitaxial method, a vibration beam 3 that is thick in the height direction cannot be formed because the tensile strain decreases in the case where it is thicker than about 5 μm.

SUMMARY OF THE INVENTION

One of illustrative aspects of the present invention is to provide a resonant transducer having a vibration beam that is high in accuracy and is given high tensile strain.

According to one or more illustrative aspects of the present invention, there is provided a method of manufacturing a resonant transducer having a vibration beam. The method comprises: (a) providing an SOI substrate comprising: a first silicon layer; a silicon oxide layer on the first silicon layer; and a second silicon layer on the silicon oxide layer; (b) forming a first gap and second gap through the second silicon layer by etching the second silicon layer using the silicon oxide layer as an etching stop layer; (c) forming an impurity diffusion source layer on the second silicon layer, wherein the impurity diffusion source layer is configured to diffuse impurity into the second silicon layer; (d) forming an impurity diffused layer in a surface portion of the second silicon layer by diffusing the impurity from the impurity diffusion source layer through heat treatment for the SOI substrate; (e) removing the impurity diffusion source layer through etching; and (f) removing at least a portion of the silicon oxide layer through etching such that an air gap is formed between the first silicon layer and a region of the second silicon layer surrounded by the first and second gaps, wherein the region of the second silicon layer surrounded by the first and second gaps serves as the vibration beam.

According to one or more illustrative aspects of the present invention, the steps (e) and (f) are performed at the same time.

According to one or more illustrative aspects of the present invention, the step (f) is performed after the step (e).

According to one or more illustrative aspects of the present invention, the impurity diffusion source layer is configured to diffuse impurity including atomic whose radius is shorter than that of silicon into the second silicon layer.

According to one or more illustrative aspects of the present invention, the impurity includes boron or phosphorus.

According to one or more illustrative aspects of the present invention, the step (c) is performed after the step (b). The step (c) comprises: (i) forming the impurity diffusion source layer on an upper surface of the second silicon layer, on an inner wall surface of the second silicon layer that is in contact with the first and second gaps, and on a portion of the silicon oxide layer which is exposed through the first and second gaps.

According to one or more illustrative aspects of the present invention, the step (b) is performed after the step (c). The step (b) comprises: forming the first gap and the second gap through the impurity diffusion source layer and the second silicon layer.

According to one or more illustrative aspects of the present invention, the method further comprises (g) forming a mask layer on the second silicon layer, wherein the mask layer is configured to adjust impurity amount of the impurity to be diffused into the second silicon layer. The step (c) comprises: forming the impurity diffusion source layer on the mask layer.

According to one or more illustrative aspects of the present invention, the step (c) is performed after the step (b), and the step (g) is performed between the step (b) and the step (c). The step (g) comprises: (i) forming the mask layer on an upper surface of the second silicon layer, on an inner wall surface of the second silicon layer that is in contact with the first and second gaps, and on a portion of the silicon oxide layer which is exposed through the first and second gaps. The step (c) comprises: (i) forming the impurity diffusion source layer on the mask layer.

According to one or more illustrative aspects of the present invention, the step (c) is performed after the step (b), and the step (g) is performed between the step (a) and the step (b). The step (b) comprises: (i) forming the first gap and the second gap through the mask layer and the second silicon layer. The step (c) comprises: (i) forming the impurity diffusion source layer on the mask layer, on an inner wall surface of the second silicon layer that is in contact with the first and second gaps, and on a portion of the silicon oxide layer which is exposed through the first and second gaps.

According to the present invention, if no tensile strain is imparted to the vibration beam even while no measurement pressure is applied to it, the vibration beam may be buckled when a measurement pressure is applied to it, resulting in a state that a measurement cannot be performed. In view of this, the vibration beam is given tensile strain by adding, to it, an impurity such as boron (B) or phosphorus (P) that is shorter in atomic radius than silicon (Si).

The diffusion length that is necessary for producing desired tensile strain can be shortened by diffusing an impurity into the vibration beam from the three directions after its formation. The shortened diffusion length provides advantages that the necessary heat treatment time can be shortened greatly and that the degree of a wafer warp due to film stress can be reduced.

High tensile strain can be obtained by controlling the impurity concentration of the vibration beam up to a value almost corresponding to the terminal solid solubility of boron in silicon by adjusting the duration and the temperature of the heat treatment.

A thick vibration beam can be formed that is given high tensile strain that cannot be attained by the epitaxial method.

Other aspects and advantages of the present invention will be apparent from the following description, the drawings and the claims.

BRIEF DESCRIPTION OF THE DRAWINGS

FIG. 17 is a table showing how the essential part of the related-art resonant transducer shown in FIG. 6 operates.

DETAILED DESCRIPTION OF EXEMPLARY EMBODIMENTS

Figure 1A:
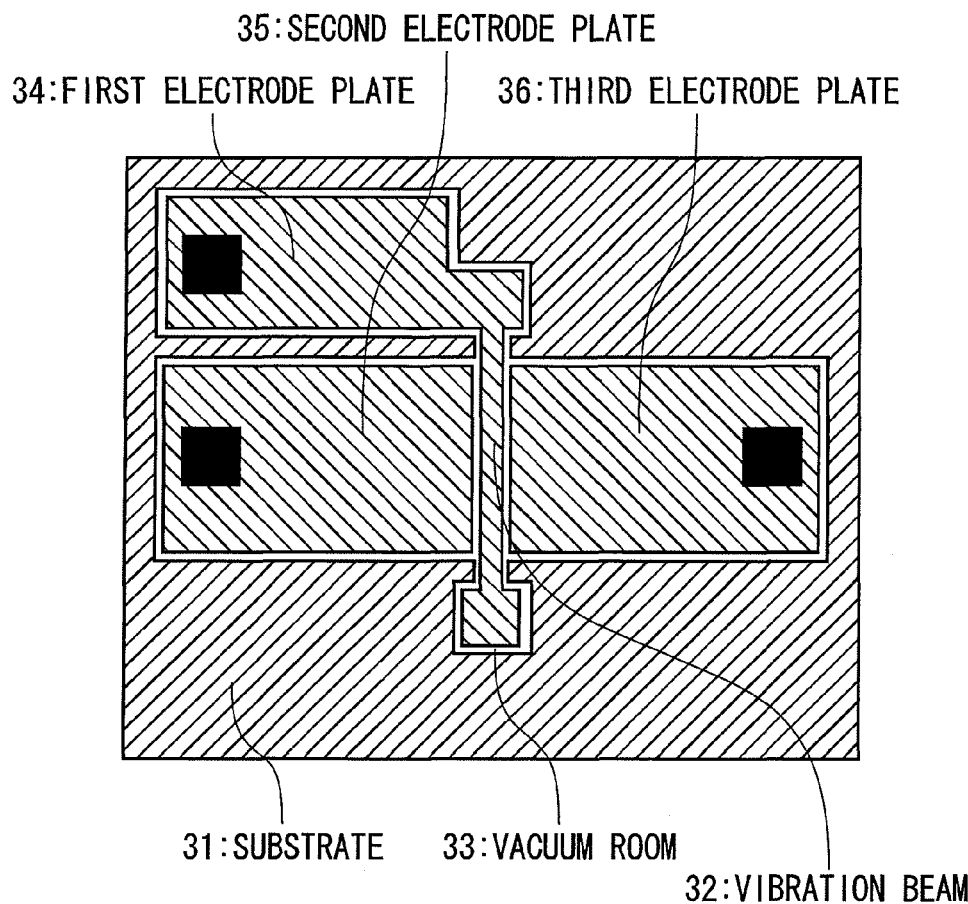
FIGS. 1A and 1B illustrate the structure of an essential part of a resonant transducer manufactured by a manufacturing method according to the present invention.

Hereinafter, exemplary embodiments of the present invention will be described with reference to the accompanying drawings. In all the drawings for the explanation of the embodiments, the members having the same functions are represented by the same reference numerals, and repeated description thereof will be omitted.

Figure 1B:
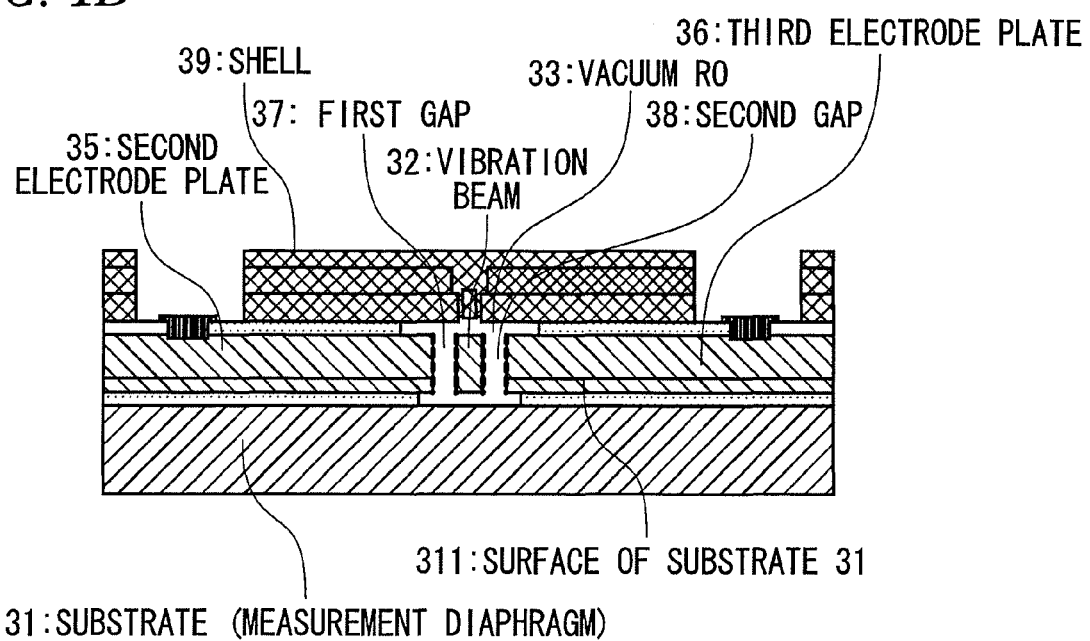

FIGS. 1A and 1B are a plan view and a sectional view, respectively, illustrating the structure of an essential part of an example resonant transducer manufactured by a manufacturing method according to the invention. The same views as FIGS. 1A and 1B are disclosed in US2012/0060607 A1, published on Mar. 15, 2012 and filed on Sep. 9, 2011 by the present Applicant Yokogawa Electric Corporation.

Referring to FIGS. 1A and 1B, a vibration beam 32 is a silicon single crystal disposed in a vacuum room 33 and is longer in the direction perpendicular to a surface 311 of a substrate 31 (measurement diaphragm) than in the direction parallel with the surface 311 in the cross section shown in FIG. 1B. The vibration beam 32 is given tensile stress with respect to the substrate 31.

A first electrode plate 34 is shaped like a plate, disposed parallel with the surface 311 of the substrate 31, and connected, at one end, to the vibration beam 32. A second electrode plate 35 and a third electrode plate 36 are shaped like a plate, disposed parallel with the surface 311 of the substrate 31, and opposed to each other with the vibration beam 32 and first and second gaps 37 and 38 interposed in between. The top surfaces of the vibration beam 32, the first electrode plate 34, the second electrode plate 35, and the third electrode plate 36 are parallel with the surface 311 of the substrate 31, and are flush with each other.

FIGS. 2A-2E illustrate a manufacturing process of the essential part of the resonant transducer according to an embodiment of the invention.

Figure 2A:
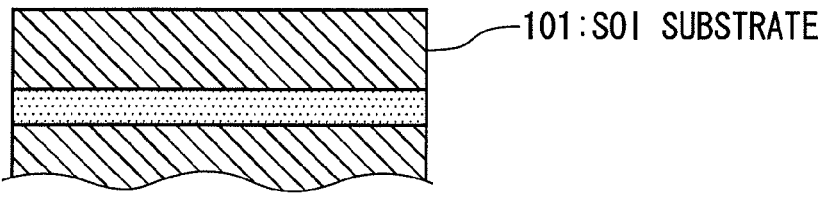
FIGS. 2A-2E are sectional views illustrating a manufacturing process of the essential part of the resonant transducer according to an embodiment of the invention.
Figure 2B:
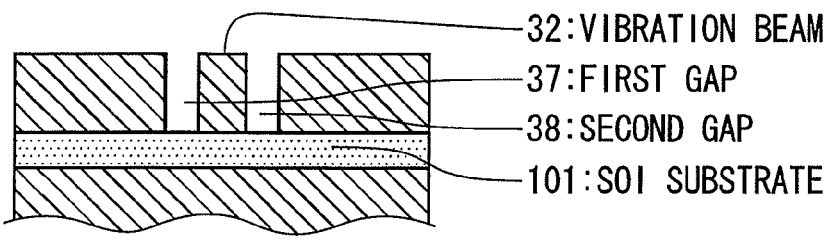

An SOI substrate 101 is prepared as shown in FIG. 2A. FIG. 2B shows a first and second gaps forming step. First and second gaps 37 and 38 are formed through a silicon layer, located on one side, of the SOI substrate 101 by etching.

Figure 2C:
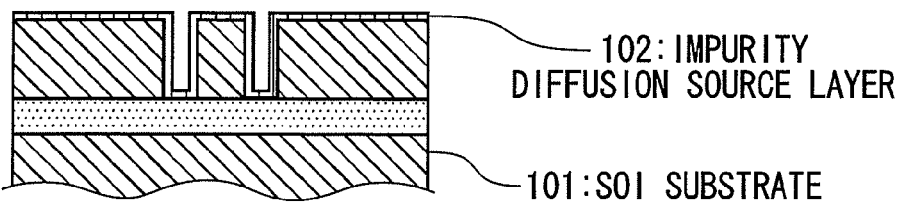

FIG. 2C shows an impurity diffusion source layer forming step. An impurity diffusion source layer 102 for giving tensile stress to a vibration beam 32 is formed on the surfaces, exposed by the first and second gaps 37 and 38, of a silicon oxide layer of the SOI substrate 101, the surfaces, opposed to each other via the first and second gaps 37 and 38, of the vibration beam 32 and the silicon layer, located on the one side, of the SOI substrate 101, and the top surfaces of the vibration beam 32 and the silicon layer, located on the one side, of the SOI substrate 101. Also, the impurity diffusion source layer 102 is configured to diffuse impurity into the silicon layer of the SOT substrate 101.

Figure 2D:
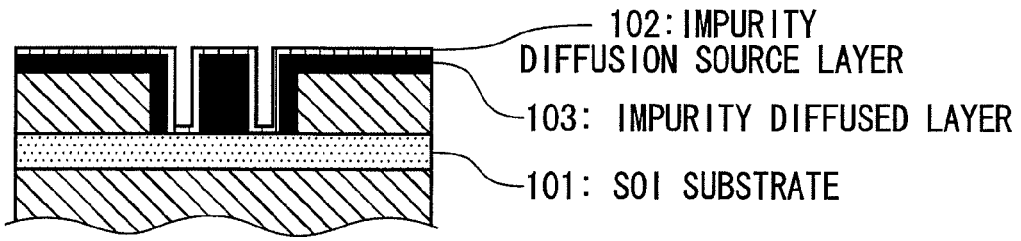

FIG. 2D shows an impurity diffused layer forming step. A heat treatment is performed, whereby an impurity is diffused from the impurity diffusion source layer 102 to the vibration beam 32 and the silicon layer, located on the one side, of the SOI substrate 101 (impurity diffused layer 103 are formed). That is, an impurity such as boron (B) is diffused into the vibration beam 32 and the silicon layer, located on the one side, of the SOI substrate 101 (impurity diffused layers 103 are formed) by a heat treatment having a temperature and a duration that are suitable for a prescribed impurity concentration. Tensile strain is thus given to the vibration beam 32 and the silicon layer.

Figure 2E:
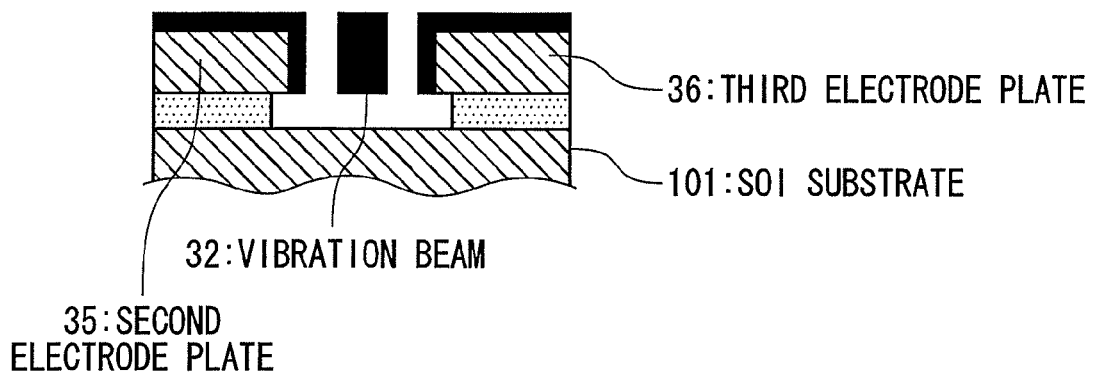

FIG. 2E shows a vibration beam isolating step. The vibration beam 32 is isolated by etching away the impurity diffusion source layer 102 and part of the silicon oxide layer of the SOI substrate 101 simultaneously in the same step or sequentially in separate steps. For example, the vibration beam 32 is isolated by etching away the impurity diffusion source layer 102 and part of the silicon oxide layer of the SOI substrate 101 by immersing the structure in hydrofluoric acid.

If no tensile strain is imparted to the vibration beam 32 even while no measurement pressure is applied to it, the vibration beam 32 may be buckled when a measurement pressure is applied to it, resulting in a state that a measurement cannot be performed. In view of this, the vibration beam 32 is given tensile strain by adding, to it, an impurity such as boron (B) or phosphorus (P) that is shorter in atomic radius than silicon (Si).

The diffusion length that is necessary for producing desired tensile strain can be shortened by diffusing an impurity into the vibration beam 32 from the three directions after its formation. The shortened diffusion length provides advantages that the necessary heat treatment time can be shortened greatly and that the degree of a wafer warp due to film stress can be reduced.

High tensile strain can be obtained by controlling the impurity concentration of the vibration beam 32 up to a value almost corresponding to the terminal solid solubility of boron in silicon by adjusting the duration and the temperature of the heat treatment.

A thick vibration beam 32 having high tensile strain that cannot be attained by the epitaxial method can be formed.

FIGS. 3A-3E illustrate a manufacturing process of the essential part of the resonant transducer according to another embodiment of the invention.

Figure 3A:
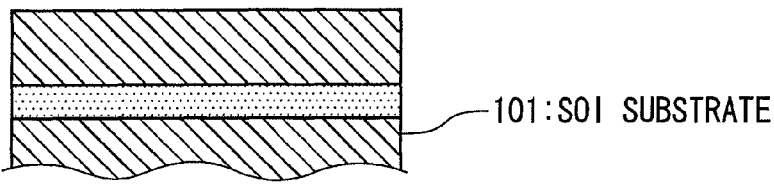
FIGS. 3A-3E are sectional views illustrating a manufacturing process of the essential part according to another embodiment of the invention.
Figure 3B:
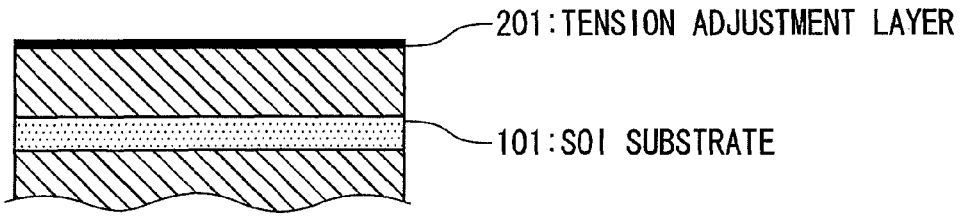

An SOI substrate 101 is prepared as shown in FIG. 3A. FIG. 3B shows a tensile strain adjustment layer forming step. A tensile strain adjustment layer 201 capable of adjusting tensile stress to be imparted is formed on the surface, located on one side, of a silicon layer of the SOI substrate 101. In this example, the tensile strain adjustment layer 201 is a silicon oxide (SiO$_2$) layer. However, the tensile strain adjustment layer 201 need not always be a silicon oxide (SiO$_2$) layer and may consist of plural layers.

Figure 3C:
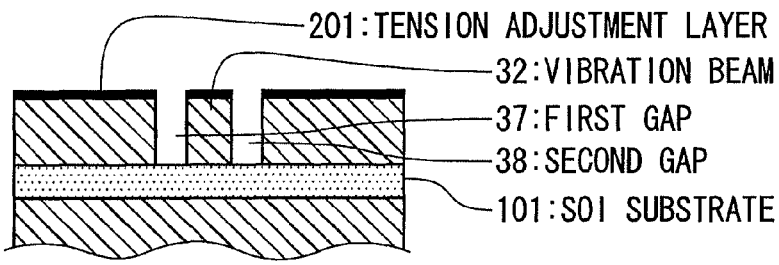

FIG. 3C shows a first and second gaps forming step. First and second gaps 37 and 38 are formed through the tensile strain adjustment layer 201 and the silicon layer, located on the one side, of the SOI substrate 101 by etching. In other words, the tensile strain adjustment layer 201 is an impurity amount adjustment layer configured to adjust the impurity amount of the impurity to be diffused into the silicon layer of the SOI substrate 101.

Figure 3D:
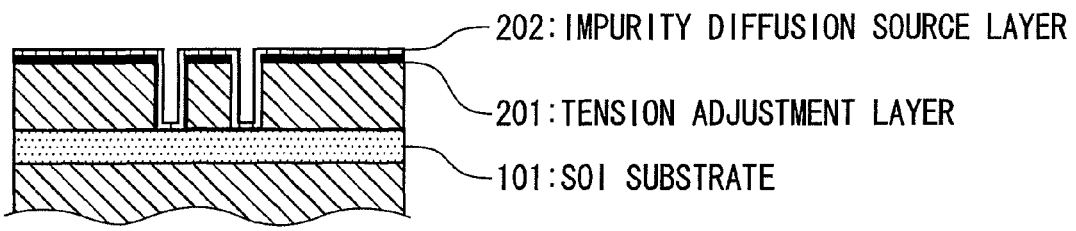

FIG. 3D shows an impurity diffusion source layer forming step. An impurity diffusion source layer 202 for giving tensile stress to a vibration beam 32 is formed on the surfaces, exposed by the first and second gaps 37 and 38, of a silicon oxide layer of the SOI substrate 101, the surfaces, opposed to each other via the first and second gaps 37 and 38, of the vibration beam 32 and the silicon layer, located on the one side, of the SOI substrate 101, and the surface of the tensile strain adjustment layer 201. Also, the impurity diffusion source layer 202 is configured to diffuse impurity into the silicon layer of the SOI substrate 101

Figure 3E:
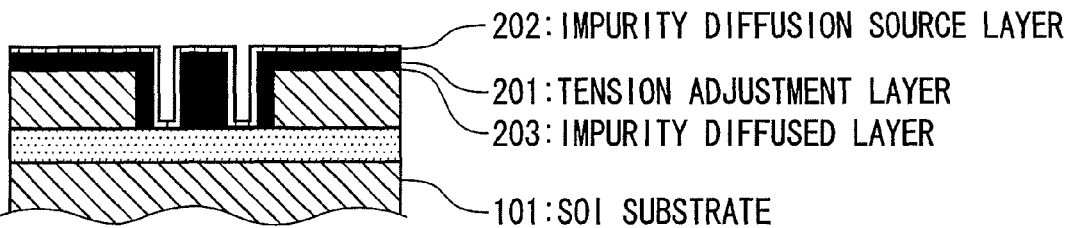

FIG. 3E shows an impurity diffused layer forming step. A heat treatment is performed, whereby an impurity is diffused from the impurity diffusion source layer 202 to the vibration beam 32 and the silicon layer, located on the one side, of the SOI substrate 101 (impurity diffused layers 203 are formed).

Then, although no drawing is used because this step is similar to the step of FIG. 2E, the vibration beam 32 is isolated by etching away the impurity diffusion source layer 102 and part of the silicon oxide layer of the SOI substrate 101.

If no tensile strain is imparted to the vibration beam 32 even while no measurement pressure is applied to it, the vibration beam 32 may be buckled when a measurement pressure is applied to it, resulting in a state that a measurement cannot be performed. In view of this, the vibration beam 32 is given tensile strain by adding, to it, an impurity such as boron (B) or phosphorus (P) that is shorter in atomic radius than silicon (Si).

The diffusion length that is necessary for producing desired tensile strain can be shortened by diffusing an impurity into the vibration beam 32 from the three directions after its formation. The shortened diffusion length provides advantages that the necessary heat treatment time can be shortened greatly and that the degree of a wafer warp due to film stress can be reduced.

High tensile strain can be obtained by controlling the impurity concentration of the vibration beam 32 up to a value almost corresponding to the terminal solid solubility of boron in silicon by adjusting the duration and the temperature of the heat treatment.

It is possible to form a thick vibration beam 32 having high tensile strain that cannot be attained by the epitaxial method.

The degree of impurity diffusion into the vibration beam 32 and the silicon layer, located on the one side, of the SOI substrate 101 which are protected by the tensile strain adjustment layer 201 can be adjusted by the thickness of the tensile strain adjustment layer 201.

FIGS. 4A-4E illustrate a manufacturing process of the essential part according to still another embodiment of the invention.

Figure 4A:
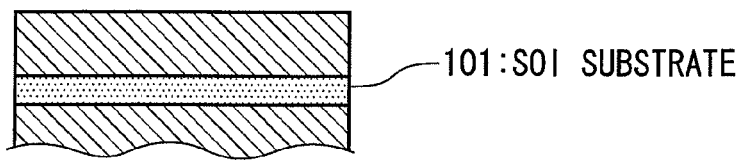
FIGS. 4A-4E are sectional views illustrating a manufacturing process of the essential part according to still another embodiment of the invention.
Figure 4B:
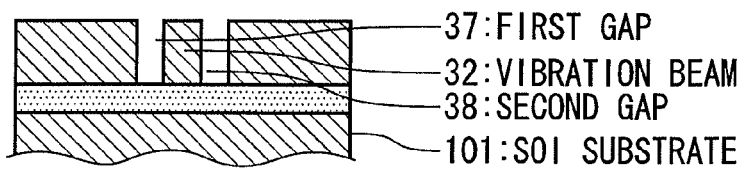

An SOI substrate 101 is prepared as shown in FIG. 4A. FIG. 4B shows a first and second gaps forming step. First and second gaps 37 and 38 are formed through a silicon layer, located on one side, of the SOI substrate 101 by etching.

Figure 4C:
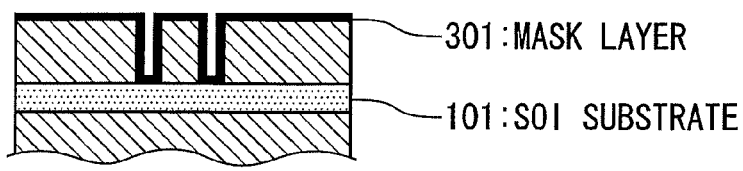

FIG. 4C shows a mask layer forming step. A mask layer 301 is formed on the surfaces, exposed by the first and second gaps 37 and 38, of a silicon oxide layer of the SOI substrate 101, the surfaces, opposed to each other via the first and second gaps 37 and 38, of a vibration beam 32 and the silicon layer, located on the one side, of the SOI substrate 101, and the top surfaces of the vibration beam 32 and the silicon layer, located on the one side, of the SOI substrate 101.

Figure 4D:
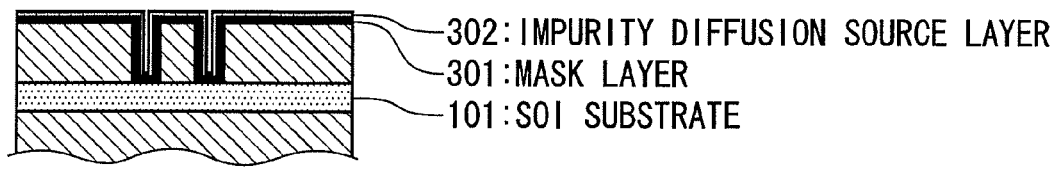

FIG. 4D shows an impurity diffusion source layer forming step. An impurity diffusion source layer 302 for giving tensile stress to the vibration beam 32 is formed on the surface of the mask layer 301. Also, the impurity diffusion source layer 302 is configured to diffuse impurity into the silicon layer of the SOI substrate 101

Figure 4E:
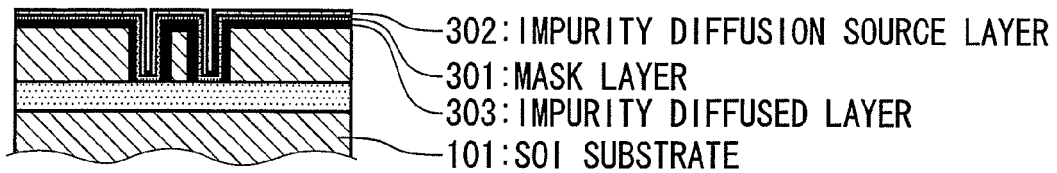

FIG. 4E shows an impurity diffused layer forming step. A heat treatment is performed, whereby an impurity is diffused from the impurity diffusion source layer 302 to the vibration beam 32 and the silicon layer, located on the one side, of the SOI substrate 101 (impurity diffused layers 303 are formed).

Then, although no drawing is used because this step is similar to the step of FIG. 2E, the vibration beam 32 is isolated by etching away the impurity diffusion source layer 302, the mask layer 301, and part of the silicon oxide layer of the SOI substrate 101.

If no tensile strain is imparted to the vibration beam 32 even while no measurement pressure is applied to it, the vibration beam 32 may be buckled when a measurement pressure is applied to it, resulting in a state that a measurement cannot be performed. In view of this, the vibration beam 32 is given tensile strain by adding, to it, an impurity such as boron (B) or phosphorus (P) that is shorter in atomic radius than silicon (Si).

The diffusion length that is necessary for producing desired tensile strain can be shortened by diffusing an impurity into the vibration beam 32 from the three directions after its formation. The shortened diffusion length provides advantages that the necessary heat treatment time can be shortened greatly and that the degree of a wafer warp due to film stress can be reduced.

High tensile strain can be obtained by controlling the impurity concentration of the vibration beam 32 up to a value almost corresponding to the terminal solid solubility of boron in silicon by adjusting the duration and the temperature of the heat treatment.

It is possible to form a thick vibration beam 32 having high tensile strain that cannot be attained by the epitaxial method.

The degree of impurity diffusion into the vibration beam 32 which is protected by the mask layer 301 can be adjusted by the thickness of the mask layer 301.

FIGS. 5A-5E illustrate a manufacturing process of the essential part of the resonant transducer according to a further embodiment of the invention.

Figure 5A:
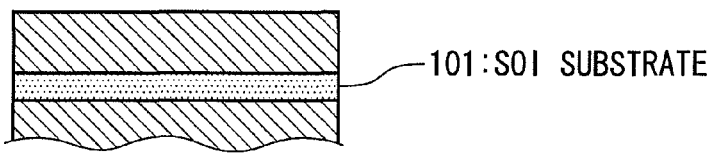
FIGS. 5A-5E are sectional views illustrating a manufacturing process of the essential part according to a further embodiment of the invention.
Figure 5B:
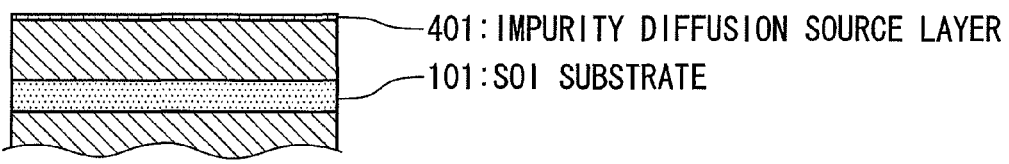

An SOI substrate 101 is prepared as shown in FIG. 5A. FIG. 5B shows an impurity diffusion source layer forming step. An impurity diffusion source layer 401 for giving tensile stress to a vibration beam 32 is formed on the surface of the silicon layer, located on one side, of the SOI substrate 101.

Figure 5C:
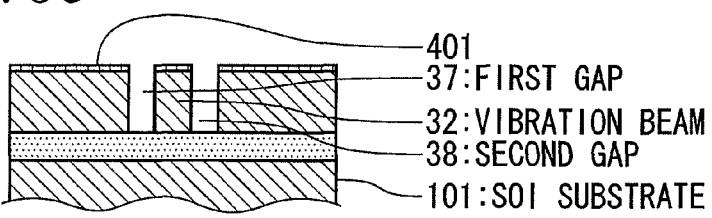

FIG. 5C shows a first and second gaps forming step. First and second gaps 37 and 38 are formed through the impurity diffusion source layer 401 and the silicon layer, located on the one side, of the SOI substrate 101 by etching.

Figure 5D:
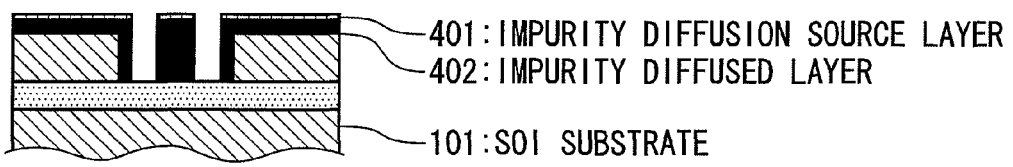

FIG. 5D shows an impurity diffused layer forming step. A heat treatment is performed, whereby an impurity is diffused from the impurity diffusion source layer 401 to the vibration beam 32 and the silicon layer, located on the one side, of the SOI substrate 101 (impurity diffused layers 402 are formed).

Figure 5E:
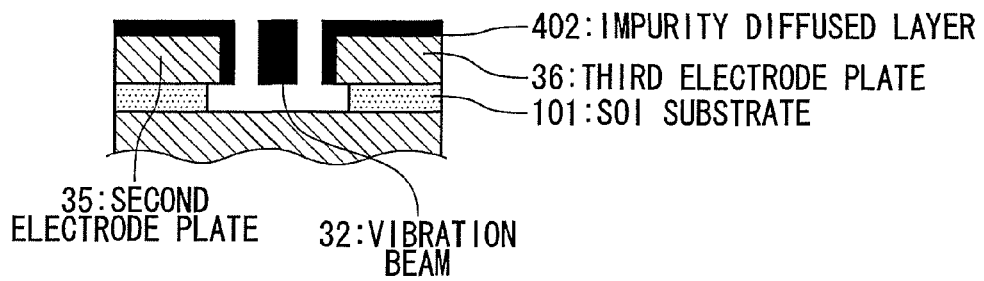
Figure 6:
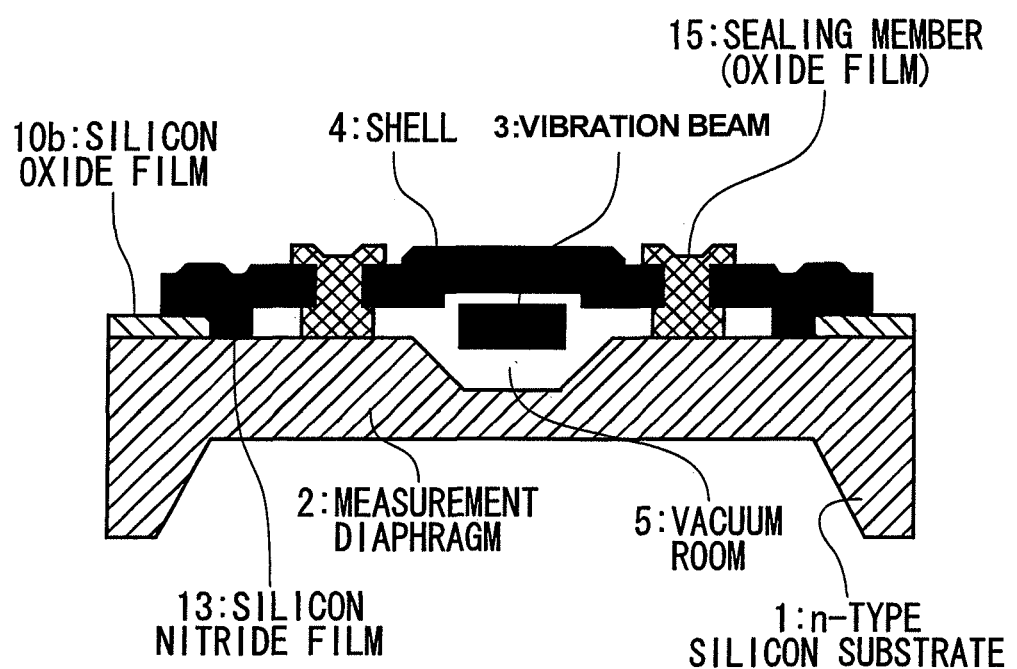
FIG. 6 illustrates the structure of an essential part of a related-art resonant transducer.
Figure 7:
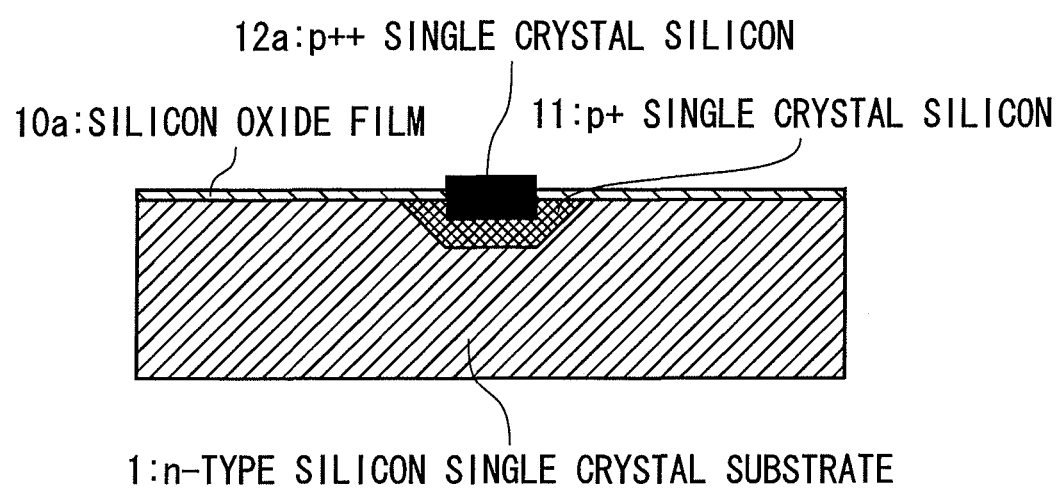
FIG. 7 is a first sectional view illustrating a manufacturing process of the essential part of the related-art resonant transducer shown in FIG. 6.
Figure 8:
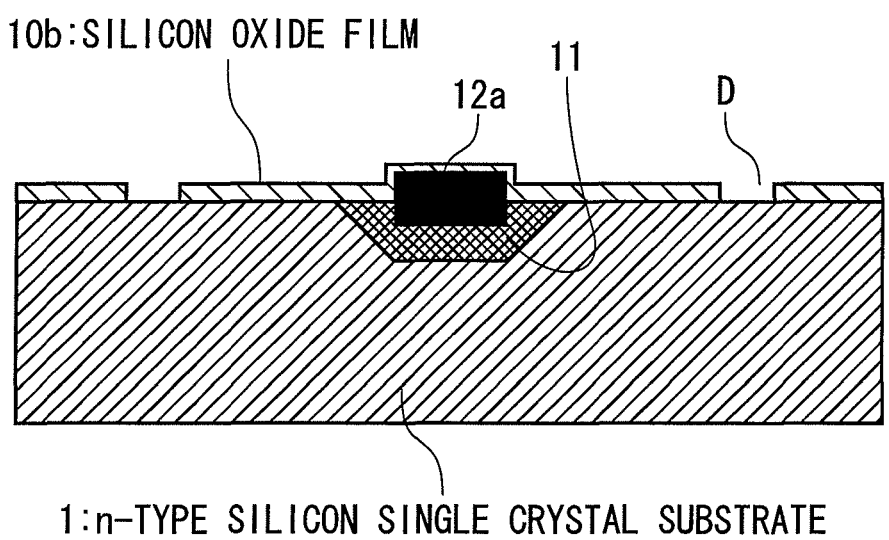
FIG. 8 is a second sectional view illustrating the manufacturing process of the essential part of the related-art resonant transducer shown in FIG. 6.
Figure 9:
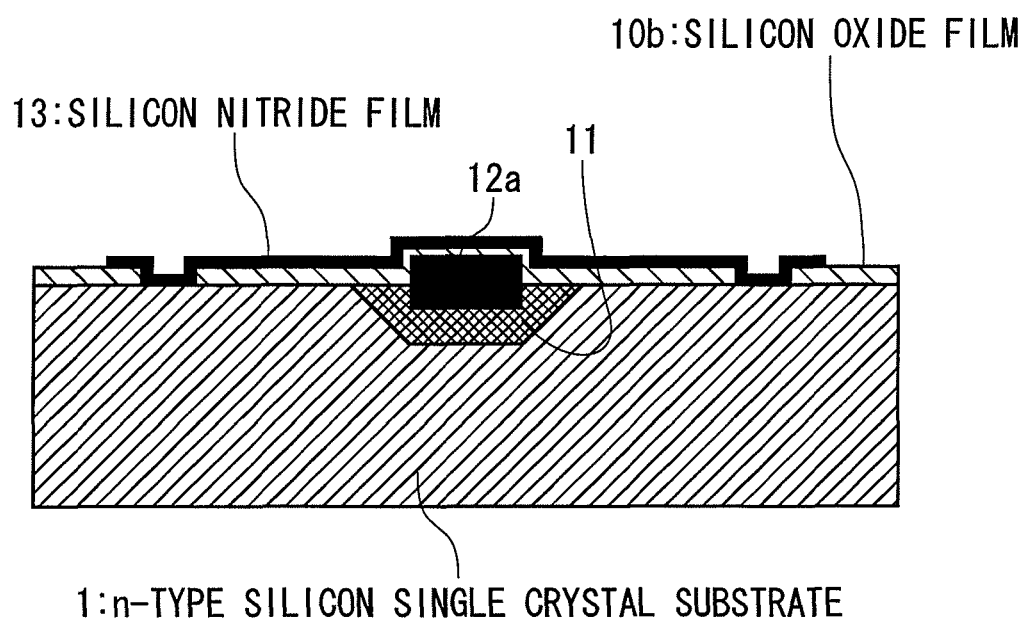
FIG. 9 is a third sectional view illustrating the manufacturing process of the essential part of the related-art resonant transducer shown in FIG. 6.
Figure 10:
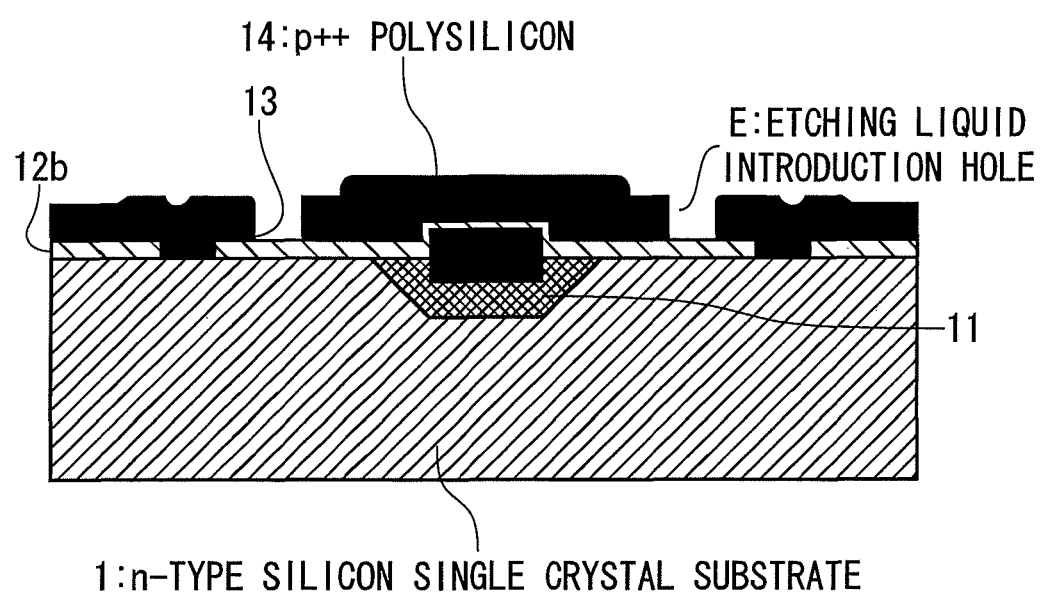
FIG. 10 is a fourth sectional view illustrating the manufacturing process of the essential part of the related-art resonant transducer shown in FIG. 6.
Figure 11:
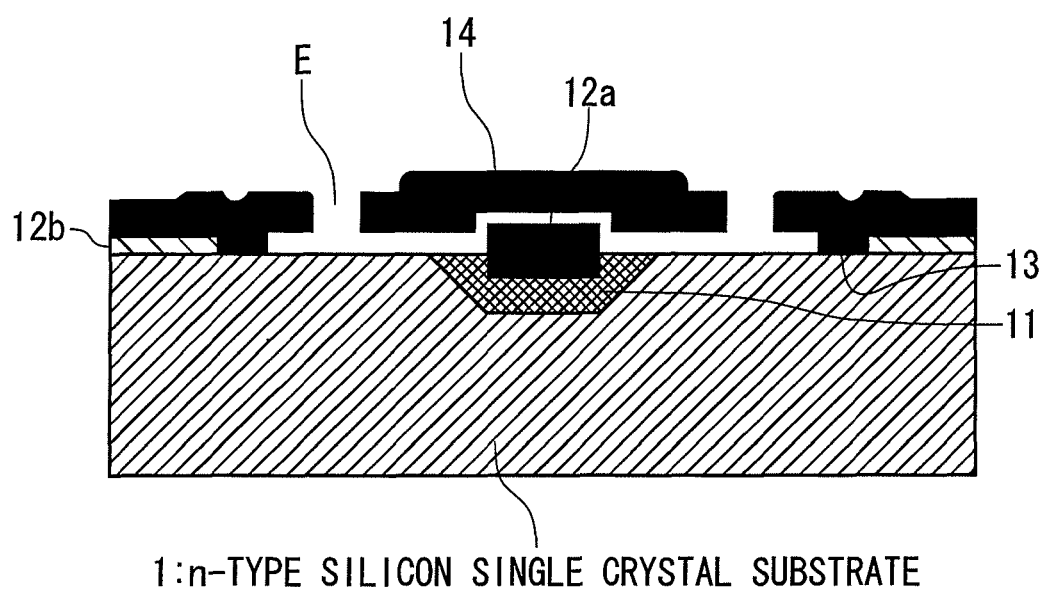
FIG. 11 is a fifth sectional view illustrating the manufacturing process of the essential part of the related-art resonant transducer shown in FIG. 6.
Figure 12:
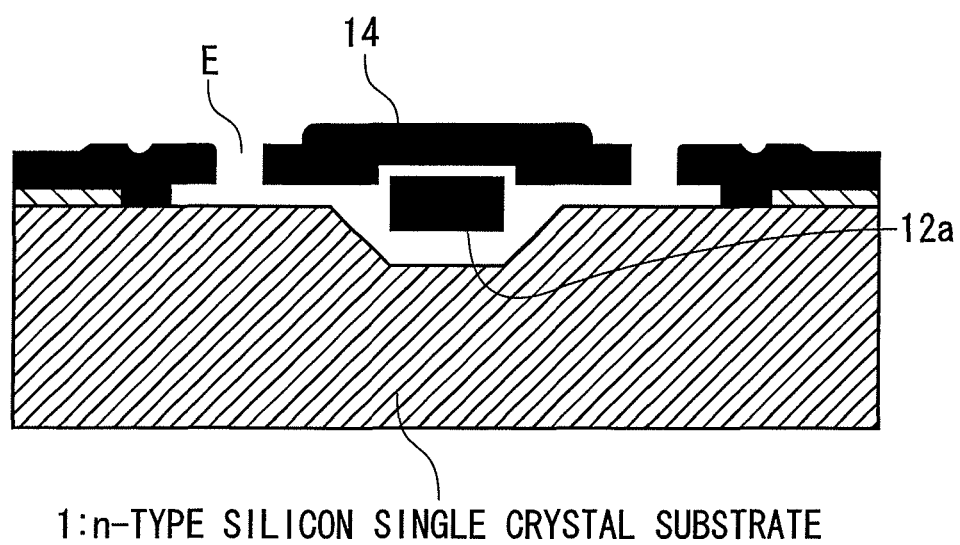
FIG. 12 is a sixth sectional view illustrating the manufacturing process of the essential part of the related-art resonant transducer shown in FIG. 6.
Figure 13:
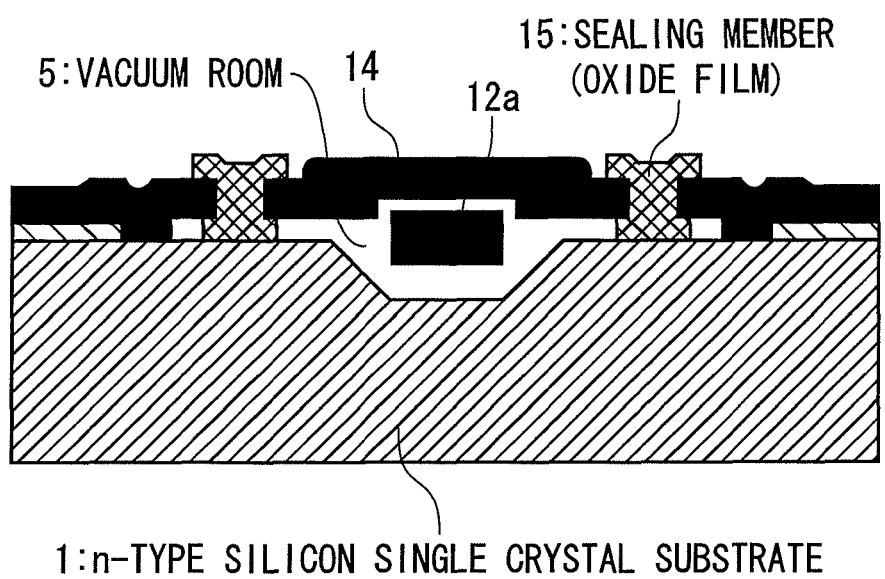
FIG. 13 is a seventh sectional view illustrating the manufacturing process of the essential part of the related-art resonant transducer shown in FIG. 6.
Figure 14:
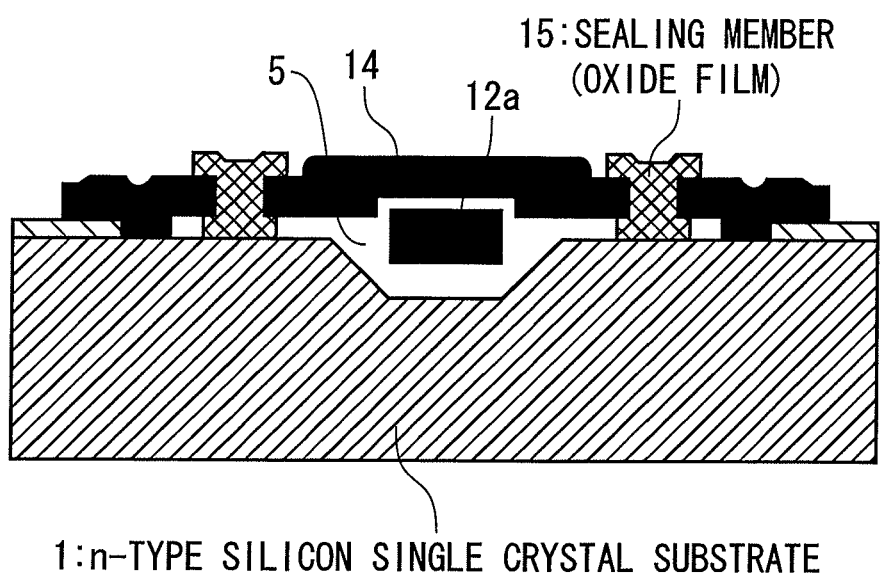
FIG. 14 is an eighth sectional view illustrating the manufacturing process of the essential part of the related-art resonant transducer shown in FIG. 6.
Figure 15:
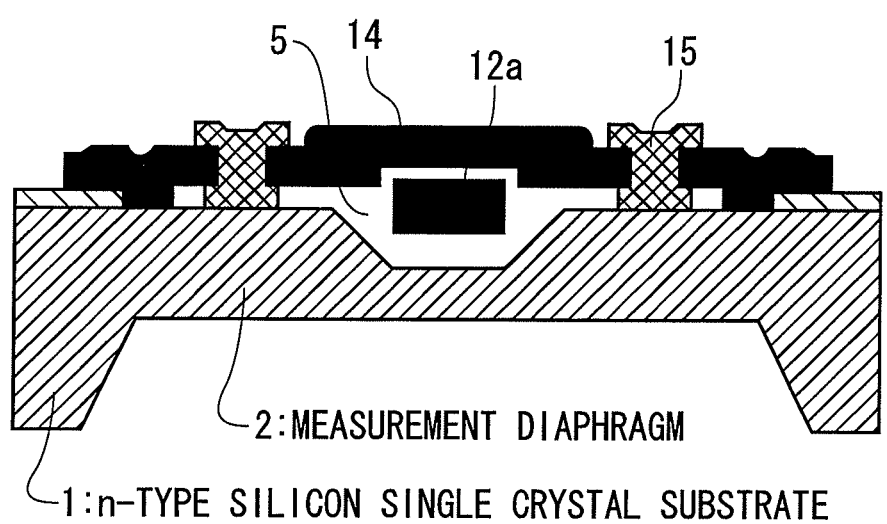
FIG. 15 is a ninth sectional view illustrating the manufacturing process of the essential part of the related-art resonant transducer shown in FIG. 6.
Figure 16A:
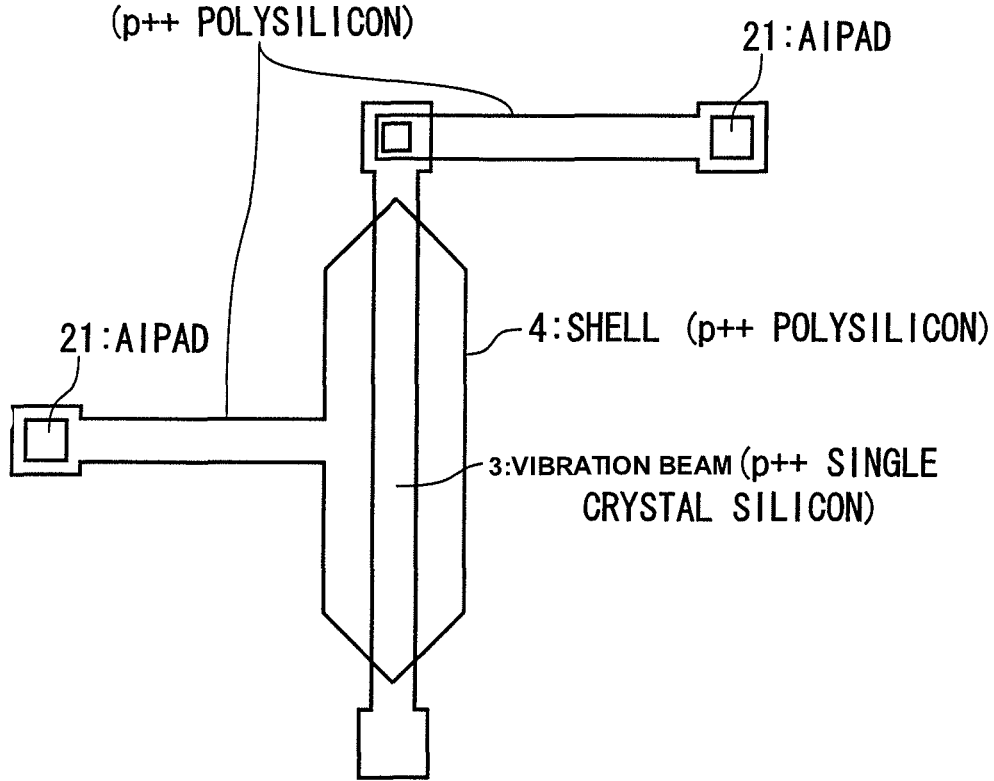
FIGS. 16A and 16B illustrate a circuit corresponding to the essential part of the related-art resonant transducer shown in FIG. 6.
Figure 16B:
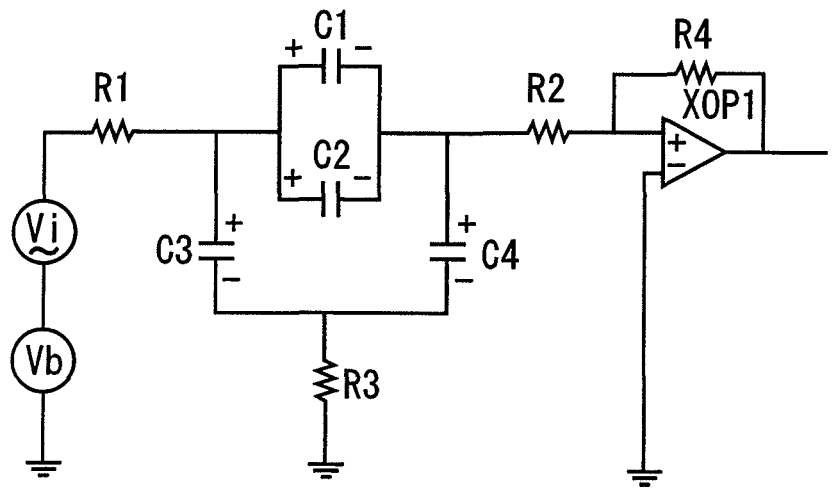

FIG. 5E shows a vibration beam isolating step. The vibration beam 32 is isolated by etching away the impurity diffusion source layer 401 and part of a silicon oxide layer of the SOI substrate 101 simultaneously in the same step or sequentially in separate steps.

Several other layers may be formed on the impurity diffusion source layer 401. For example, the impurity diffusion source layer 401 may be patterned using, as a mask, a silicon oxide layer ($SiO_2$ layer) formed thereon.

If no tensile strain is imparted to the vibration beam 32 even while no measurement pressure is applied to it, the vibration beam 32 may be buckled when a measurement pressure is applied to it, resulting in a state that a measurement cannot be performed. In view of this, the vibration beam 32 is given tensile strain by adding, to it, an impurity such as boron (B) or phosphorus (P) that is shorter in atomic radius than silicon (Si).

The diffusion length that is necessary for producing desired tensile strain can be shortened by diffusing an impurity into the vibration beam 32 from the three directions after its formation. The shortened diffusion length provides advantages that the necessary heat treatment time can be shortened greatly and that the degree of a wafer warp due to film stress can be reduced.

High tensile strain can be obtained by controlling the impurity concentration of the vibration beam 32 up to a value almost corresponding to the terminal solid solubility of boron in silicon by adjusting the duration and the temperature of the heat treatment.

It is possible to form a thick vibration beam 32 having high tensile strain that cannot be attained by the epitaxial method.

The embodiment of FIGS. 5A-5E is free of a problem that a PBF solution (described below) cannot easily be introduced to first and second gaps 37 and 38 having a high aspect ratio when it is applied to the surfaces defined by the first and second gaps 37 and 38.

One method for forming the impurity diffusion source layer 102, 202, 302, or 401 is to applying a PBF solution which is composed of boron oxide ($B_2O_3$), an organic binder, and a solvent to the subject surface and then performing firing in an oxygen-nitrogen atmosphere at 600° and pre-deposition drive-in at an even high temperature.

Other methods that do not use a PBF solution are as follows:

(1) Diffusing boron (B) atoms using boron tribromide ($BBr_3$), a boric acid ($H_3BO_3$)-boron nitride sintered body (BN), a thermally decomposed boron nitride sintered body (PBN), boron chloride, or the like.

(2) Diffusing phosphorus (P) atoms using phosphorus oxychloride ($POCl_3$), phosphorus tribromide ($PBr_3$), phosphorus trichloride ($PCl_3$), phosphorus oxide ($P_2O_3$), or the like.

(3) Forming a diffusion source layer of boron oxide ($B_2O_3$) or the like by CVD, for example.

In each of the above embodiments, in the heat treatment step for diffusing the impurity into the vibration beam 32, a single heat treatment is without removing the impurity diffusion source layer 102, 202, 302, or 401. Alternatively, the impurity diffused layers 103, 203, 303, or 402 may be formed by performing a first heat treatment to diffuse a prescribed amount of impurity into the vibration beam 32, then removing the impurity diffusion source layer 102, 202, 302, or 401, and performing a second heat treatment to diffuse the impurity in the depth direction in the vibration beam 32. The removal of the impurity diffusion source layer 102, 202, 302, or 401 makes it possible to adjust the amount of impurity diffused into the vibration beam 32 by preventing diffusion of an excessive amount of impurity into the vibration beam 32.

In each of the above embodiments, the impurity diffusion source layer 102, 202, 302, or 401 is formed only once. Alternatively, impurity diffusion into the vibration beam 32 may be performed by several sets of formation of an impurity diffusion source layer 102, 202, 302, or 401, a heat treatment for diffusion, and its removal. This makes it possible to increase the amount of impurity diffused into the vibration beam 32.

While certain embodiments have been described, these embodiments have been presented by way of example only, and are not intended to limit the scope of the invention. Indeed, the novel methods and systems described herein may be embodied in a variety of other forms. Furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A method of manufacturing a resonant transducer having a vibration beam, the method comprising:
(a) providing an SOI substrate comprising: a first silicon layer; a silicon oxide layer on the first silicon layer; and a second silicon layer on the silicon oxide layer;

(b) forming a first gap and second gap through the second silicon layer by etching the second silicon layer using the silicon oxide layer as an etching stop layer;

(c) forming an impurity diffusion source layer on the second silicon layer, wherein the impurity diffusion source layer is configured to diffuse impurity into the second silicon layer;

(d) forming an impurity diffused layer in a surface portion of the second silicon layer by diffusing the impurity from the impurity diffusion source layer through heat treatment for the SOI substrate;

(e) removing the impurity diffusion source layer through etching; and (f) removing at least a portion of the silicon oxide layer through etching such that an air gap is formed between the first silicon layer and a region of the second silicon layer surrounded by the first and second gaps, wherein the region of the second silicon layer surrounded by the first and second gaps serves as the vibration beam, wherein the impurity diffusion source layer is formed directly on the second silicon layer.

2. The method of claim 1, wherein the steps (e) and (f) are performed at the same time.

3. The method of claim 1, wherein the step (f) is performed after the step (e).

4. The method of claim 1, wherein the impurity diffusion source layer is configured to diffuse impurity including atomic whose radius is shorter than that of silicon into the second silicon layer.

5. The method of claim 1, wherein the impurity includes boron or phosphorus.

6. The method of claim 1, wherein the step (c) is performed after the step (b), wherein the step (c) comprises:

(i) forming the impurity diffusion source layer on an upper surface of the second silicon layer, on an inner wall surface of the second silicon layer that is in contact with the first and second gaps, and on a portion of the silicon oxide layer which is exposed through the first and second gaps.

7. The method of claim 1, wherein the step (b) is performed after the step (c), wherein the step (b) comprises:

forming the first gap and the second gap through the impurity diffusion source layer and the second silicon layer.

* * * * *